US009640901B2

(12) United States Patent
Hasegawa et al.

(10) Patent No.: US 9,640,901 B2
(45) Date of Patent: May 2, 2017

(54) ELECTRICAL CONNECTION BOX WITH A FLEXIBLE LINKING PART

(71) Applicant: Yazaki Corporation, Tokyo (JP)

(72) Inventors: Hirotaka Hasegawa, Kakegawa (JP); Michihiro Ishihara, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/785,144

(22) PCT Filed: Apr. 24, 2014

(86) PCT No.: PCT/JP2014/061640
§ 371 (c)(1),
(2) Date: Oct. 16, 2015

(87) PCT Pub. No.: WO2014/175408
PCT Pub. Date: Oct. 30, 2014

(65) Prior Publication Data

US 2016/0072222 A1 Mar. 10, 2016

(30) Foreign Application Priority Data

Apr. 26, 2013 (JP) ................................ 2013-094464

(51) Int. Cl.
*H01R 12/00* (2006.01)
*H05K 1/00* (2006.01)
(Continued)

(52) U.S. Cl.
CPC ......... *H01R 13/533* (2013.01); *H01H 50/048* (2013.01); *H01H 50/14* (2013.01)

(58) Field of Classification Search
CPC .... H01R 9/226; H01R 13/629; H01R 13/533; H05K 5/0026
(Continued)

(56) References Cited

U.S. PATENT DOCUMENTS 5,488,345 A 1/1996 Seki et al.
5,629,663 A 5/1997 Seki et al.
(Continued)

FOREIGN PATENT DOCUMENTS

JP 07-169382 A 7/1995
JP 2006-288190 A 10/2006
(Continued)

OTHER PUBLICATIONS

Written Opinion issued Jul. 22, 2014, issued by the International Searching Authority in counterpart International Patent Application No. PCT/JP2014/061640, (PCT/ISA/237).
(Continued)

*Primary Examiner* — Hae Moon Hyeon
(74) *Attorney, Agent, or Firm* — Sughrue Mion, PLLC

(57) ABSTRACT

An electrical connection box (10), including: a relay (20) which has a locking projection (20K); and a connection box main body (30) which has a pressing projection (30K) that is engaged with the locking projection (20K), and which is formed with a storage space (30P) that stores the relay (20), in which a guide wall (30W) which is provided to stand on a boundary of the storage space is formed across the entire circumference of the boundary of the storage space in the connection box main body, and in which the pressing projection (30K) is formed at a narrow linking part (30B) of the guide wall in a direction in which the guide wall is provided to stand.

1 Claim, 6 Drawing Sheets

(51) Int. Cl.
*H01R 13/533* (2006.01)
*H01H 50/04* (2006.01)
*H01H 50/14* (2006.01)

(58) Field of Classification Search
USPC ........................................ 439/76.2, 345, 949
See application file for complete search history.

(56) References Cited

U.S. PATENT DOCUMENTS

| | | | | |
|---|---|---|---|---|
| 5,680,088 | A | 10/1997 | Seki et al. | |
| 7,717,720 | B2 | 5/2010 | Ikeda | |
| 8,002,569 | B2 * | 8/2011 | Ikeda | H01H 50/048 439/374 |
| 8,011,944 | B2 * | 9/2011 | Umehara | H01R 13/58 439/345 |
| 2007/0010123 | A1 | 1/2007 | Ikeda | |
| 2010/0055962 | A1 | 3/2010 | Ikeda et al. | |
| 2011/0195591 | A1 * | 8/2011 | Mumper | H01R 13/6272 439/345 |
| 2011/0299229 | A1 | 12/2011 | De La Reza et al. | |

FOREIGN PATENT DOCUMENTS

| | | | |
|---|---|---|---|
| JP | 2007-020357 | A | 1/2007 |
| JP | 2010-057305 | A | 3/2010 |

OTHER PUBLICATIONS

Record of Patentability issued Nov. 5, 2015, issued by the International Searching Authority in counterpart International Patent Application No. PCT/JP2014/061640, (PCT/IB/338 & PCT/IB/373).
Search Report dated Jul. 22, 2014, issued by the International Searching Authority in counterpart International Application No. PCT/JP2014/061640 (PCT/ISA/210).
Written Opinion dated Jul. 22, 2014, issued by the International Searching Authority in counterpart International Application No. PCT/JP2014/061640 (PCT/ISA/237).
Communication dated Feb. 22, 2017 issued by the Japanese Patent Office in counterpart Japanese Patent Application No. 2013-094464.

* cited by examiner

ELECTRICAL CONNECTION BOX WITH A FLEXIBLE LINKING PART

TECHNICAL FIELD

The present invention relates to an electrical connection box in which a relay is mounted.

BACKGROUND ART

In order to electrically connect a battery and an inverter to each other, an electrical connection box has been loaded on an electric vehicle, including a hybrid vehicle, from the related art. However, in the electrical connection box, there is a case where rattling, such as oscillation of a vehicle, is generated, and there is a concern that a terminal becomes worn out due to oscillation between a terminal of a relay and a terminal on the electrical connection box side when the rattling is generated.

Here, an electrical connection box which prevents rattling of a certain large-sized heavy relay which is mounted on a connection box main body of the electrical connection box is disclosed (refer to PTL 1).

<Electrical Connection Box Described in PTL 1>

FIG. 4 is a perspective view of a part of an electrical connection box described in PTL 1.

In FIG. 4, an electrical connection box 100 described in PTL 1 is configured of a relay 200, and a connection box main body 300 for mounting the relay 200. Here, the relay 200 and the connection box main body 300 will be briefly described.

<Relay 200>

The relay 200 is a rectangular parallelepiped object which is made of an insulating resin and which stores a relay therein.

Four male terminals 200T protrude downward from the outside of a bottom portion of the relay 200, and the four male terminals 200T are inserted into a terminal insertion hole 300T of an upper cover 310 when the relay 200 is stored in a storage space 300P of the upper cover 310.

In addition, locking projections 200K as follows are respectively formed on one side surface of the relay 200 and on a surface opposite to the side surface.

<Locking Projection 200K>

The locking projection 200K is an object having a shape of a triangular prism which is made of a perpendicular surface that stands perpendicularly from the side surface, and an inclined surface which gradually approaches the side surface downward (insertion direction) from the perpendicular surface.

When the relay 200 is stored in the storage space 300P of the upper cover 310, the locking projection 200K is engaged with an elastic locking frame piece 300K of the upper cover 310, and the relay 200 is integrated with the upper cover 310, and then with the connection box main body 300.

<Connection Box Main Body 300>

The connection box main body 300 is made of the upper cover 310 made of an insulating resin, and a lower cover 320 which is equivalently made of an insulating resin. The upper cover 310 and the lower cover 320 are integrated with each other as an elastic locking frame piece 300R which is on the upper cover 310 is engaged with a locking projection 320R which is on the lower cover 320.

<Upper Cover 310>

On the upper cover 310, four guide walls 300W for storing the rectangular parallelepiped relay 200 in the storage space 300P of the upper cover 310 are installed to stand on a surface of the upper cover 310.

<Guide Wall 300W>

Each of the guide walls 300W is L-shaped when viewed from a plan view, and is made as wall surfaces 300U and 300U which respectively extend only by a predetermined length are installed to stand along two sides at a right angle.

Four guide walls 300W are disposed at four corners along an outline of the rectangular parallelepiped relay 200 when viewed from a plan view at a predetermined interval by making each of the right angles (valley) face the inside on an upper surface of the upper cover 310. Accordingly, the storage space 300P which is surrounded by the four guide walls 300W becomes a part which stores the relay 200.

<Terminal Insertion Hole 300T>

In the storage space 300P of the upper cover 310, a plurality (four in the embodiment, but only three of these are seen in FIG. 4) of terminal insertion holes 300T are respectively formed passing through the upper cover 310.

In each of the terminal insertion holes 300T, when the relay 200 is stored in the storage space 300P of the upper cover 310, the male terminal 200T of the relay 200 is inserted, and the male terminal 200T is inserted into a female terminal on the lower cover 320 side which is installed immediately below the terminal insertion hole 300T.

<Elastic Locking Frame Piece 300K>

One guide wall 300W and a guide wall 300W which is adjacent thereto are separated at a predetermined interval, and the elastic locking frame piece 300K is installed to stand in the space between the guide walls 300W.

Equivalently, in a space on a facing side of the squared storage space 300P of the upper cover 310, one more elastic locking frame piece 300K is installed to stand.

When the relay 200 is stored in the storage space 300P of the upper cover 310, the locking projection 200K of the relay 200 is engaged with the elastic locking frame piece 300K, and the relay 200 is locked to the upper cover 310, and then to the connection box main body 300.

<Rattling Prevention Projections 300A and 300B>

On each of the L-shaped guide walls 300W, two projections 300A and 300A which extend in a horizontal direction from the inside of both upper ends toward the relay 200 when performing mounting are formed, and two projections 300B and 300B which extend in the horizontal direction from the inside of a lower bent portion toward the relay 200 when performing mounting are formed.

Regarding the height in the horizontal direction from the wall surface 300U of the projection 300A and the projection 300B, the height of the projection 300A is formed to be slightly higher than the height of the projection 300B.

<Lower Cover 320>

Although not illustrated in FIG. 4, the lower cover 320 stores the necessary number of bus bars inside thereof, and a connection terminal which is electrically connected to each bus bar and stands in an upright direction. In addition, each connection terminal is disposed immediately below the terminal insertion hole 300T of the upper cover 310 into which the male terminal 200T of the relay 200 is inserted.

The lower cover 320 is used being fixed to a vehicle body or the like, and a fixing bracket 320B is formed thereon.

<Rattling Elimination Function of Electrical Connection Box Described in PTL 1>

Next, functions of the electrical connection box described in PTL 1 will be described by using FIGS. 5 and 6.

FIG. 5 is a sectional view when viewed in a direction of an A-A arrow of the electrical connection box which has the relay of FIG. 4 mounted thereon. FIG. 6 is a plan view of the electrical connection box which has the relay of FIG. 4 mounted thereon.

In FIG. 5, the projections 300A on each upper side protrude in the horizontal direction from the inner surface of the guide wall 300W to be longer than the projections 300B on each lower side. Similarly to FIGS. 5 and 6, the projection 300A on the upper side comes into contact with relay 200 without a gap, and the projection 300B on the lower side is disposed having a slight gap S1 between the projection 300B and the relay 200. Since each guide wall 300W is narrow and high, the guide wall 300W itself has elasticity of a resin material in a direction of a plate width, and the projection 300A on the upper side elastically abuts against the relay 200 in a state where the guide wall 300W is bent slightly outward.

Meanwhile, a part on a lower end side of the guide wall 300W is unlikely to be bent, by providing the slight gap S1 between the projection 300B on the lower side and the relay 200, it is possible to reliably insert the relay 200 until the relay 200 abuts against an upper wall surface of the upper cover 310 along the projection 300B on the lower side. When the relay 200 moves due to oscillation, the projection 300B on the lower side has a function of coming into contact with an outer wall surface of the relay 200 and preventing the oscillation and vibration.

As one pair of projections 300A on the upper side are disposed on both sides of the guide wall 300W, it is possible to stably support the outer wall surface of the relay 200 in the horizontal direction.

<Points to Overcome in Electrical Connection Box Described in PTL 1>

Locking the relay 200 and the connection box main body 300 to each other is achieved by engaging the elastic locking frame piece 300K which is provided to stand in a space between the guide wall 300W and the adjacent guide wall 300W, and the locking projection 200K which is formed on the side surface of the relay 200.

CITATION LIST

Patent Literature

[PTL 1] JP-A-2007-20357

SUMMARY OF INVENTION

Technical Problem

However, when distortion is generated to the electrical connection box due to a high level of oscillation, the guide wall 300W and the guide wall 300W adjacent thereto which are separated from each other are relatively deformed, and the above-described rattling elimination function is deteriorated. For this reason, there is a concern that a contact portion between the male terminal 200T on the relay 200 side and the terminal on the connection box main body 300 side becomes worn out due to rattling between the relay 200 and the connection box main body 300.

Problem of the Present Invention

In consideration of the above-described problem, an object of the present invention is to provide an electrical connection box in which a rattling elimination function is not deteriorated even when a high level of oscillation is generated, and thus, in which there is no concern that a contact portion between a terminal on one side of a relay and a terminal on a connection box main body side become worn out.

Solution to Problem

In order to solve the above-described problem, an electrical connection box according to (1) and (2) according to the present invention is characterized as follows.

(1) An electrical connection box, including: an electronic component which has a locking projection; and a connection box main body which has a pressing projection that is engaged with the locking projection, and which is formed with a storage space that stores the electronic component, in which a guide wall which is provided to stand on a boundary of the storage space is formed across the entire circumference of the boundary of the storage space in the connection box main body, and in which the pressing projection is formed at a narrow linking part of the guide wall in a direction in which the guide wall stands.

(2) The electrical connection box according to the above-described (1), in which a press-fit rib which presses the electronic component when the electronic component is stored in the storage space is formed on a base end side of the guide wall in the connection box main body.

According to the above-described (1), when a high level of oscillation is applied to the electrical connection box and distortion is generated to the electrical connection box, the guide wall which is formed across the entire circumference is displaced in the same direction, and is not relatively deformed as described in the above-described PTL 1. Therefore, the above-described rattling elimination function is maintained, the rattling between the electronic component and the connection box main body is not generated, and there is no concern that the contact portion is worn out.

According to the above-described (2), when the electronic component is stored in the storage space, a pressing force acts on the electronic component from the press-fit rib. Therefore, the rattling is not generated even in the lower portion of the electronic component.

Advantageous Effects of Invention

According to the above-described invention, it is possible to obtain an electrical connection box in which a rattling elimination function is not deteriorated even when a high level of oscillation is generated, and thus, in which there is no concern that a contact portion between a terminal on an electronic component side and a terminal on a connection box main body side becomes worn out.

DESCRIPTION OF EMBODIMENTS

Hereinafter, an electrical connection box according to the present invention in which a rattling elimination function is not deteriorated even when a high level of oscillation is generated, will be described based on FIGS. 1 to 3.

<Electrical Connection Box According to Present Invention>

Figure 1:
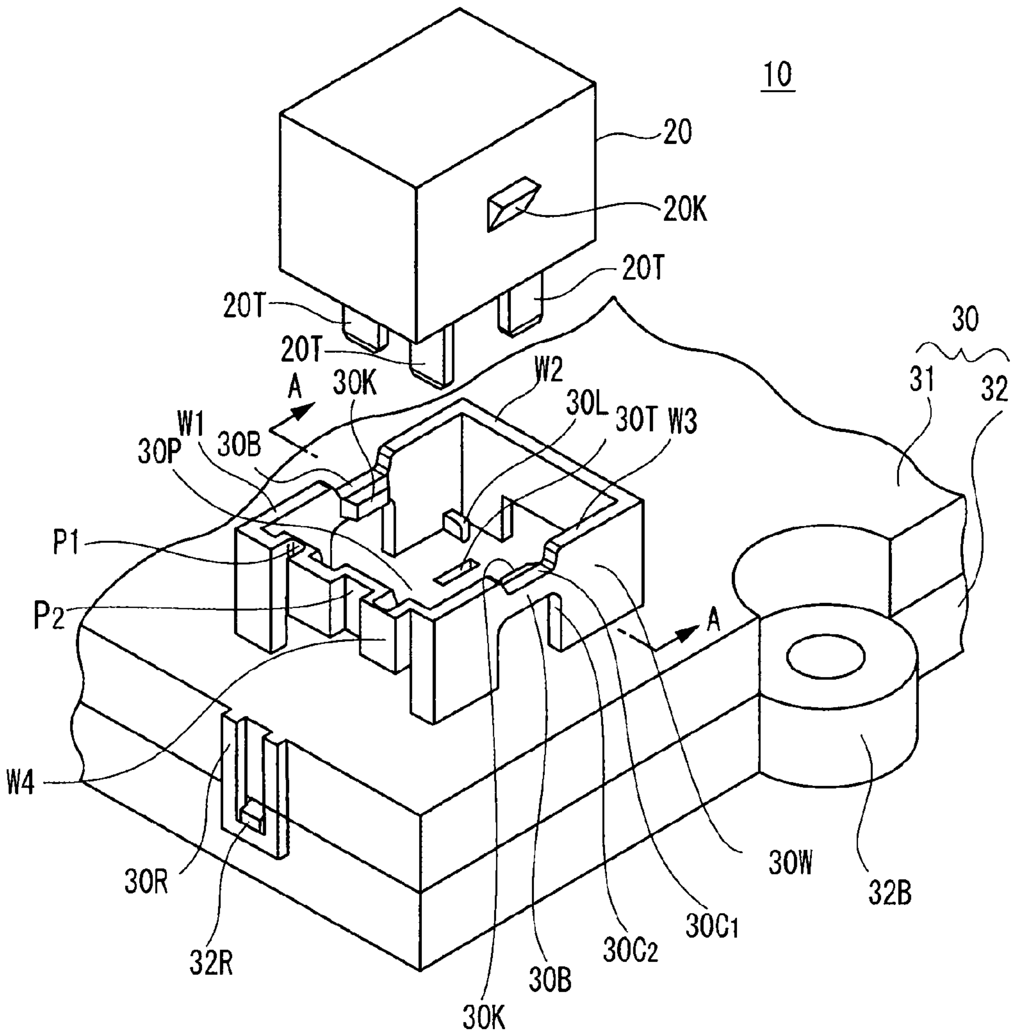
FIG. 1 is a perspective view of a part of an electrical connection box according to the present invention.

FIG. 1 is a perspective view of a part of the electrical connection box according to the present invention.

In FIG. 1, an electrical connection box 10 is configured of a relay 20 and a connection box main body 30 for mounting the relay 20. Here, the relay 20 according to the present invention and the connection box main body 30 according to the present invention will be described.

<Relay 20>

The relay 20 is a rectangular parallelepiped object which is made of an insulating resin and which stores a circuit body or an element that configures a relay therein.

However, the present invention is not limited to the relay, and an electronic component other than the relay may be employed.

Four male terminals 20T (only three of these are seen in FIG. 1) protrude downward from the outside of a bottom portion of the relay 20, and the four male terminals 20T are inserted into terminal insertion holes 30T of an upper cover 31 when the relay 20 is stored in a storage space 30P of the upper cover 31.

In addition, locking projections 20K as follows are respectively formed on one side surface of the relay 20 and on a surface opposite to the side surface.

<Locking Projection 20K>

The locking projection 20K has a shape of a triangular prism which is made of a perpendicular surface that stands perpendicularly from the side surface, and an inclined surface which gradually approaches the side surface downward (insertion direction) from the perpendicular surface.

When the relay 20 is stored in the storage space 30P of the upper cover 31, the locking projection 20K is engaged with a pressing projection 30K which is on the upper cover 31 side, and the relay 20 is integrated with the upper cover 31, and then with the connection box main body 30.

<Connection Box Main Body 30>

The connection box main body 30 is made of the upper cover 31 and a lower cover 32 which are made of an insulating resin and will be described in the following. The upper cover 31 and the lower cover 32 are integrated with each other as an elastic locking frame piece 30R which is on the upper cover 31 is engaged with a locking projection 32R which is on the lower cover 32.

<Upper Cover 31>

On a surface of the upper cover 31, a guide wall 30W is installed to stand on a boundary of the storage space in order to store the rectangular parallelepiped relay 20. The guide wall 30W is formed as a linked body across the entire circumference of the boundary of the storage space. On the upper cover 31, at a location which faces the storage space 30P surrounded by the guide wall 30W, the terminal insertion hole 30T which passes through the upper cover 31 is formed. Here, the guide wall 30W and the terminal insertion hole 30T will be described.

<Guide Wall 30W>

The guide wall 30W is a wall in which the entire circumference is linked (that is, formed across the entire circumference of the boundary of the storage space), and which has a substantially squared shape in a plan view. The guide wall 30W is made of the following: a first wall W1, a second wall W2, a third wall W3, and a fourth wall W4.

<Pressing Projection 30K of First Wall W1>

In the first wall W1, an intermediate part of the first wall W1 in a side direction is cut out from above and from below of the wall surface, and the remaining intermediate part is a linking part 30B which links both wall surfaces to each other. The linking part 30B is narrower than other parts of the first wall W1 in a direction in which the first wall W1 stands. Since the linking part 30B is a resin-made part which remains after cutting out from above and from below of the wall surface in this manner, the linking part 30B has more flexibility and elasticity than both wall surfaces. In addition, one pressing projection 30K is formed to extend inward from the inside of the linking part 30B (storage side of the relay 20).

The shape of the pressing projection 30K is a shape which is engaged with the locking projection 20K on the side surface of the relay 20 when the relay 20 is stored in the storage space 30P of the upper cover 31.

In addition, when the relay 20 is stored in the storage space 30P of the upper cover 31, the protruding height of the pressing projection 30K from the linking part 30B is the height which makes a state where a tip end of the pressing projection 30K abuts against the relay 20, and the flexible linking part 30B is bent slightly outward.

<Press-Fit Rib 30L of First Wall W1>

On a base end side of the first wall W1, specifically, on a lower inner side of both ends of the first wall W1, press-fit ribs 30L are respectively formed to extend from the inside inward one by one.

When the relay 20 is stored in the storage space 30P of the upper cover 31, the protruding height of the press-fit rib 30L from the first wall W1 is the height which makes a tip end of the press-fit rib 30L press the relay 20, and which can press-fit the relay 20 in accordance with a slight inserting force between the press-fit rib 30L of the first wall W1 and the press-fit rib 30L of the third wall W3.

<Second Wall W2>

The second wall W2 has a shape which is made by cutting out the intermediate part of the side direction from below the wall surface, and has a linear shape in a plan view.

<Third Wall W3>

The third wall W3 is configured equivalently to the first wall W1.

In other words, the third wall W3 is made by cutting out the intermediate part of the third wall W3 in the side direction from above and from below the wall surface, and the remaining intermediate part is the linking part 30B which links both wall surfaces to each other. Since the linking part 30B is a resin-made part which remains after cutting out from above and from below the wall surface in this manner, the linking part 30B has more flexibility than both wall surfaces. In addition, one pressing projection 30K is formed to extend inward from the inside of the linking part 30B.

The shape of the pressing projection 30K is a shape which is engaged with the locking projection 20K on the side surface of the relay 20 when the relay 20 is stored in the storage space 30P of the upper cover 31.

When the relay 20 is stored in the storage space 30P of the upper cover 31, the protruding height of the pressing projection 30K from the linking part 30B is the height which makes a state where the tip end of the pressing projection 30K abuts against the relay 20, and the flexible linking part 30B is bent slightly outward.

In addition, on the lower inner sides of both ends of the first wall W1, the press-fit ribs 30L are respectively formed to extend from the inside inward one by one.

When the relay 20 is stored in the storage space 30P of the upper cover 31, the protruding height of the press-fit rib 30L from the first wall W1 is the height which makes the tip end of the press-fit rib 30L press the relay 20, and which can press-fit the relay 20 in accordance with a slight inserting force between the press-fit rib 30L of the third wall W3 and the press-fit rib 30L of the first wall W1.

<Fourth Wall W4>

The fourth wall W4 has a shape made by cutting out the intermediate part in the side direction from below the wall surface, has flexibility, and is configured of the wall surface which has a zigzag shape in a plan view in which a part thereof protrudes inward. Therefore, since protruded parts P1 and P2 which protrude to the inside on the fourth wall W4 have a function of pressing the relay 20 toward the second wall W2 by elasticity due to rigidity of the fourth wall W4, the configuration thereof is simple, and the rattling in a direction from the fourth wall W4 to the second wall W2 is not generated.

<Terminal Insertion Hole 30T>

Figure 4:
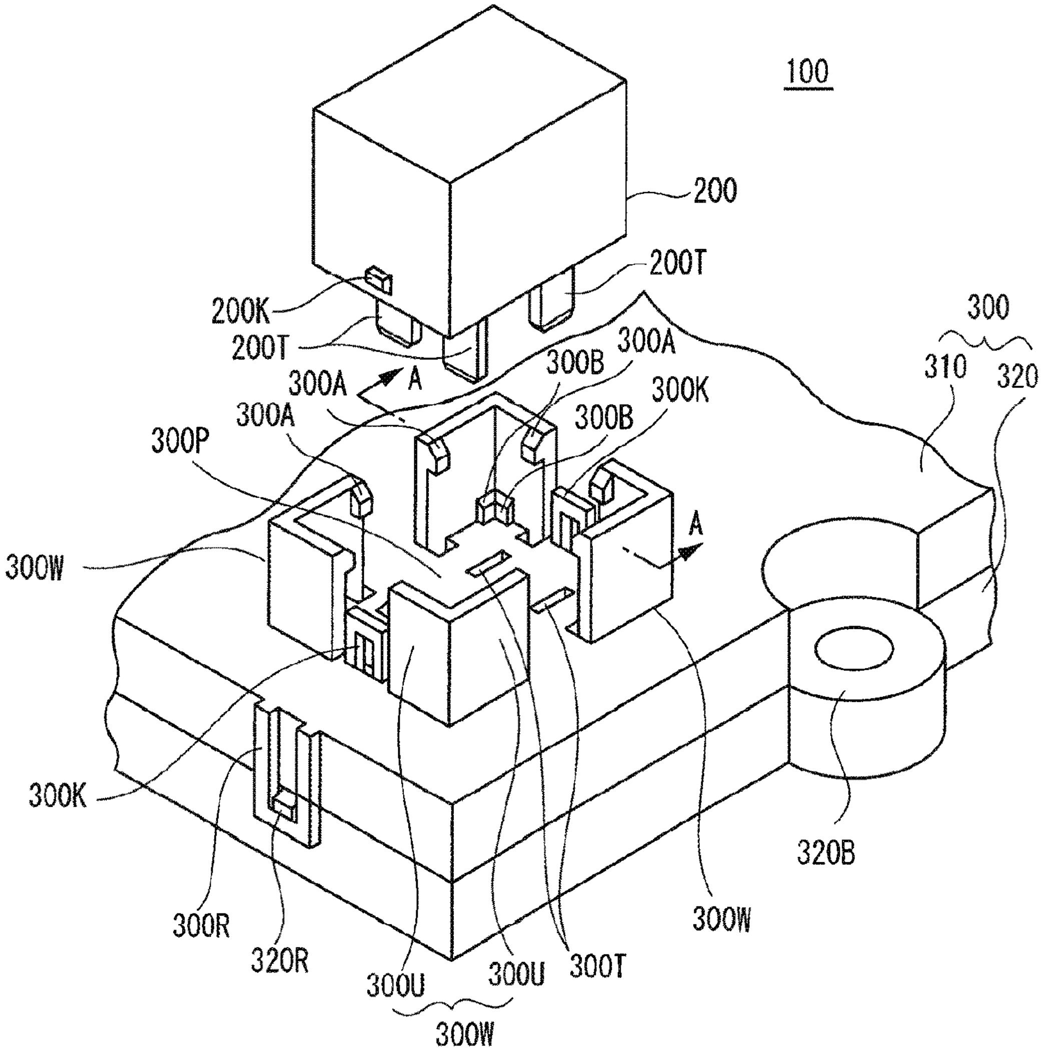
Fig. 4 PRIOR ART
FIG. 4 is a perspective view of a part of the electrical connection box described in PTL 1.
Figure 5:
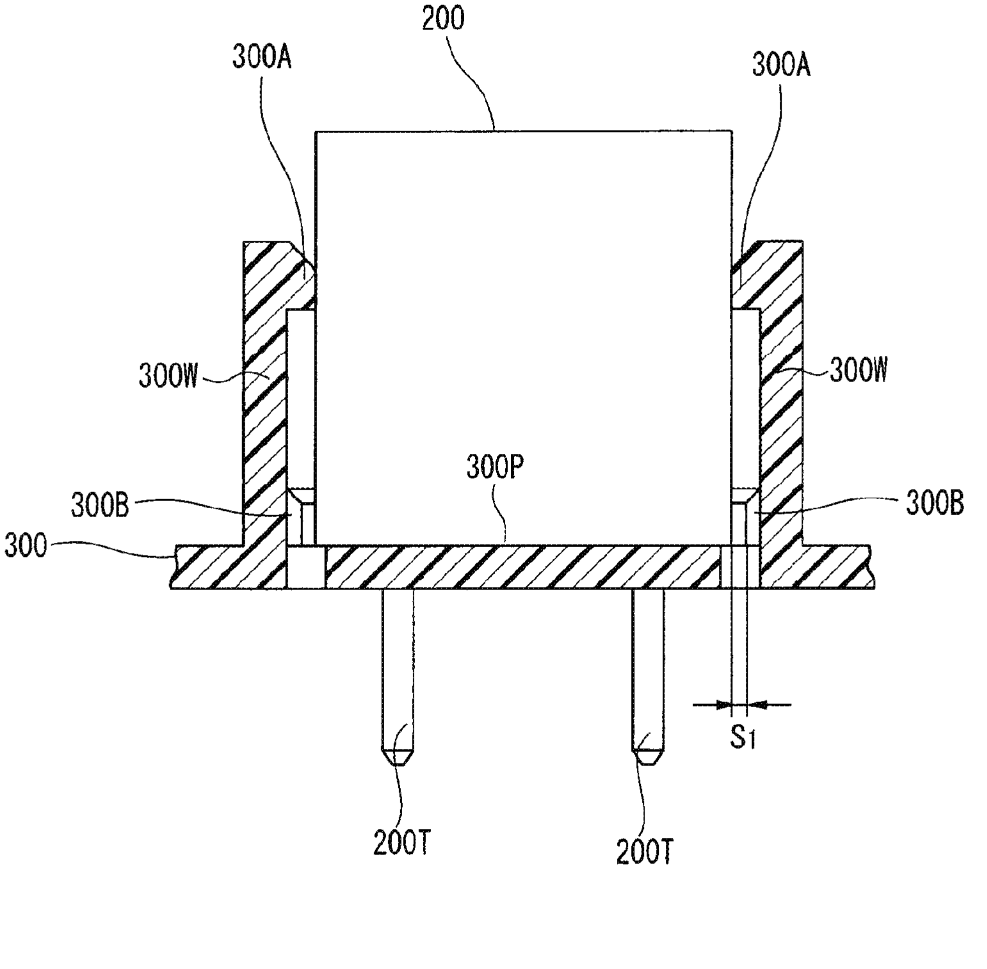
Fig. 5 PRIOR ART
FIG. 5 is a sectional view when viewed in a direction of the A-A arrow of the electrical connection box which has a relay of FIG. 4 mounted thereon.
Figure 6:
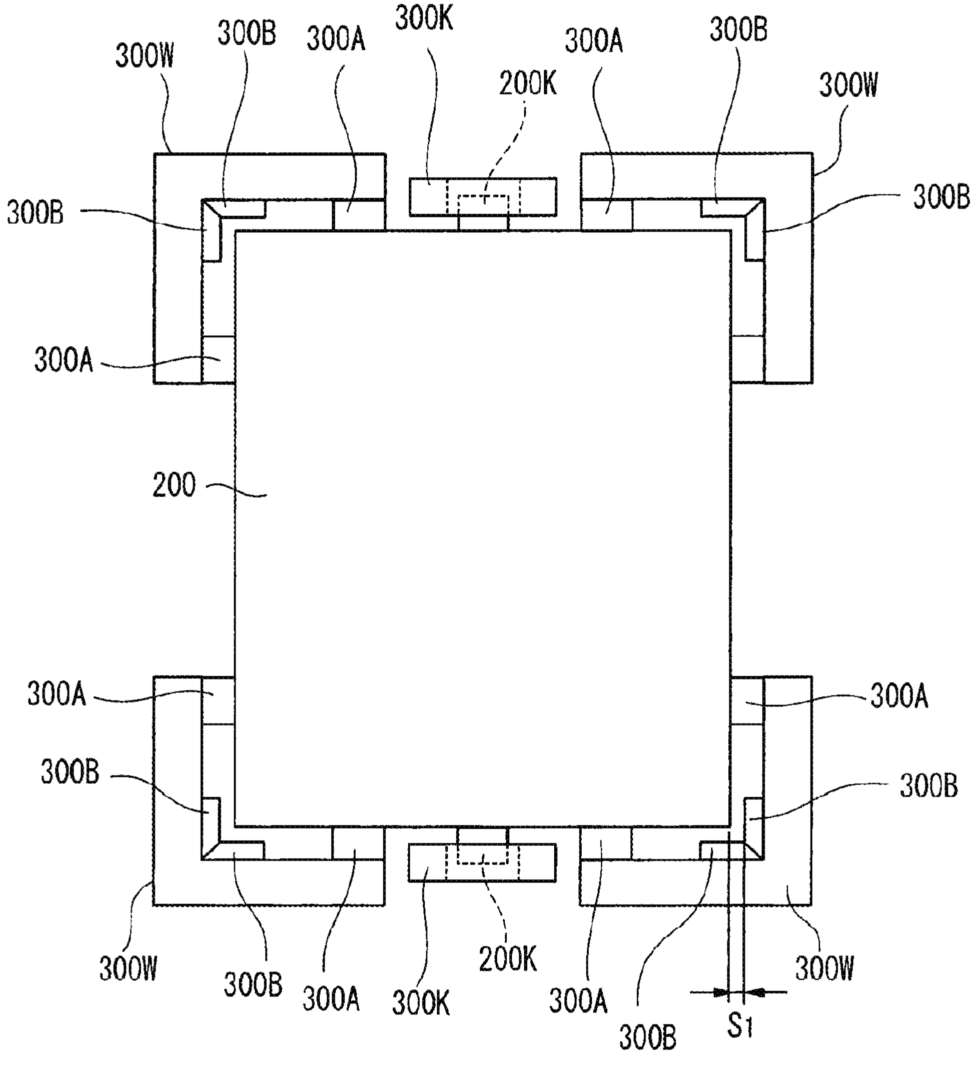
Fig. 6 PRIOR ART
FIG. 6 is a plan view of the electrical connection box which has the relay of FIG. 4 mounted thereon.

On the upper cover 31, at a location which faces the storage space 30P, four (only three are seen in FIG. 4) terminal insertion holes 30T are respectively formed passing through the upper cover 31.

In each of the terminal insertion holes 30T, when the relay 20 is stored in the storage space 30P of the upper cover 31, the male terminal 20T of the relay 20 is inserted, and the male terminal 20T is inserted into a female terminal on the lower cover 32 side which is installed immediately below the terminal insertion hole 30T.

<Lower Cover 32>

Although not illustrated in FIG. 1, the lower cover 32 stores the necessary number of bus bars inside thereof, and a connection terminal which is electrically connected to each bus bar and stands in an upright direction. In addition, each connection terminal is disposed immediately below the terminal insertion hole 30T of the upper cover 31 into which the male terminal 20T of the relay 20 is inserted.

The lower cover 32 is used being fixed to a vehicle body or the like, and a fixing bracket 32B is formed thereon.

<Rattling Elimination Function of Electrical Connection Box According to Present Invention>

Next, the rattling elimination function of the electrical connection box according to the present invention will be described by using FIGS. 2 and 3. FIG. 2 is a sectional view when viewed in a direction of an A-A arrow of the electrical connection box which has the relay of FIG. 1 mounted thereon. FIG. 3 is a plan view of the electrical connection box which has the relay of FIG. 1 mounted thereon.

Figure 2:
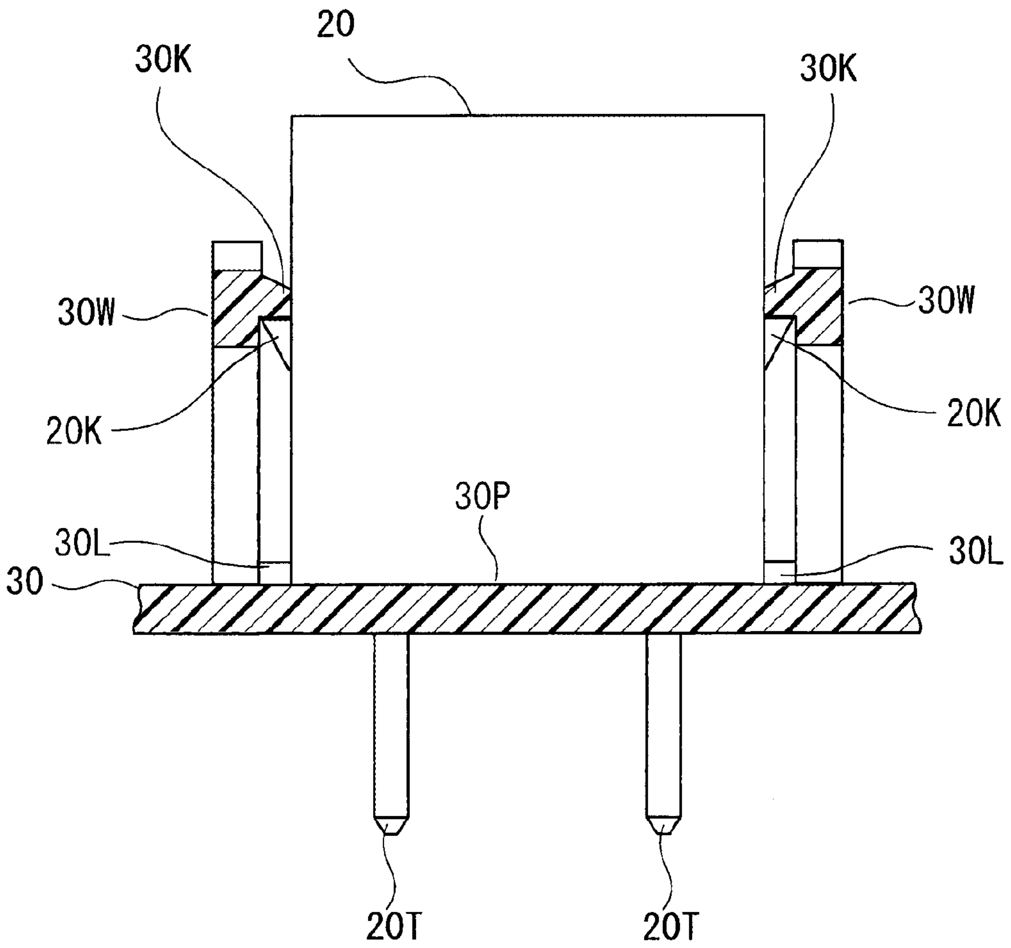
FIG. 2 is a sectional view when viewed in a direction of an A-A arrow of the electrical connection box which has a relay of FIG. 1 mounted thereon.

In FIG. 2, by the pressing projection 30K on the upper side which is on both left and right sides and the press-fit ribs 30L on each lower side, the relay 20 is mounted without a gap on the left and right upper side and lower sides thereof. In addition, in this state, since the pressing projection 30K is engaged with the locking projection 20K on the side surface of the relay 20, the relay 20 does not fall out of the connection box main body 30 even when a high level of oscillation is generated.

Figure 3:
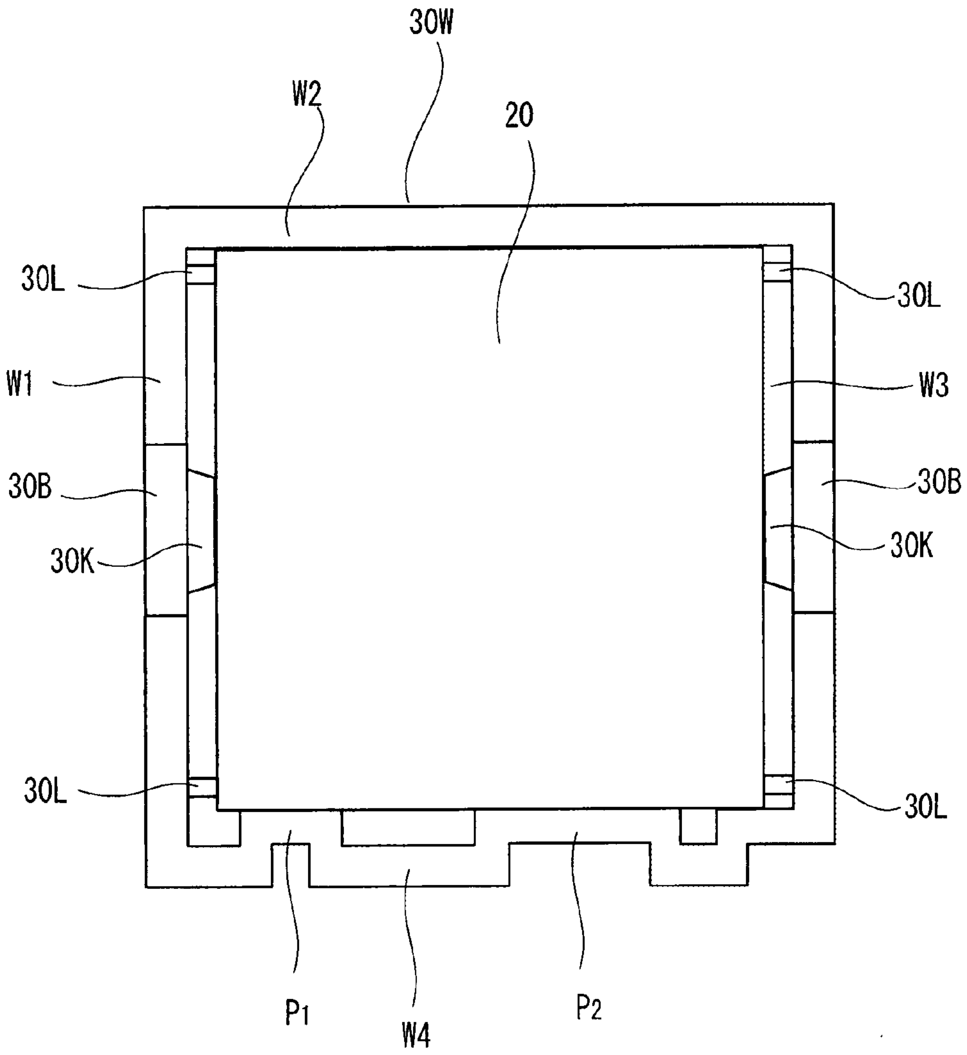
FIG. 3 is a plan view of the electrical connection box which has the relay of FIG. 1 mounted thereon.

In addition, as can be seen in FIG. 3, since the guide wall 30W in which the entire circumference is linked surrounds the relay 20 across the entire circumference, when a high level of oscillation is applied to the electrical connection box and distortion is generated to the relay 20, the guide wall 30W in which the entire circumference is linked is displaced in the same direction, and is not relatively deformed as described in the above-described PTL 1. Therefore, the above-described rattling elimination function is maintained, the rattling between the relay 20 and the connection box main body 30 is not generated, and there is no concern that the contact portion becomes worn out.

CONCLUSION

As described above, the following is achieved according to the present invention.

(1) The guide wall 30W cuts out the intermediate part of the wall surface which has a rattling elimination function from above and below, makes the narrow linking part elastic in the direction in which the guide wall 30W is provided to stand, and further, forms the pressing projection on the inside of the linking part. For this reason, when the relay is stored in the storage space of the upper cover, the pressing projection which is provided at the flexible linking part acts to press the relay. Therefore, the rattling is not generated.

(2) Equivalently, since the press-fit rib is formed on the base end side of the guide wall 30W, specifically, on the lower inner side of both ends of the guide wall 30W, when the relay is stored in the storage space of the upper cover, the pressing force acts on the relay from the press-fit rib. Therefore, the rattling is not generated even at the lower portion of the relay.

(3) Furthermore, since the guide wall 30W surrounds the entire circumferential surface of the relay 20, when a high level of oscillation is applied to the electrical connection box and distortion is generated to the electrical connection box, the guide wall 30W in which the entire circumference is linked is displaced in the same direction, and is not relatively deformed as described in the above-described PTL 1. Therefore, the above-described rattling elimination function is maintained, the rattling between the relay 20 and the connection box main body 30 is not generated, and there is no concern that the contact portion becomes worn out.

Here, the characteristics of the embodiment of the electrical connection box according to the above-described present invention are respectively briefly summarized and listed in the following [1] and [2].

[1] The electrical connection box (10), including: the electronic component (relay 20) which has the locking projection (20K); and the connection box main body (upper cover 31) which has the pressing projection (30K) that is engaged with the locking projection, and which is formed with the storage space that stores the electronic component, in which the guide wall (30W) which is provided to stand on the boundary of the storage space is formed across the entire circumference of the boundary of the storage space in the connection box main body, and in which the pressing projection is formed at the narrow linking part (30B) of the guide wall in a direction in which the guide wall stands.

[2] The electrical connection box according to the above-described [1], in which the press-fit rib (30L) which presses the electronic component when the electronic component is stored in the storage space is formed on the base end side of the guide wall in the connection box main body.

The present invention is described in detail or with reference to a specific embodiment, but it is apparent for those skilled in the art that various changes and modifications can be added without departing from the spirit and the scope of the present invention.

The present application is based on Japanese Patent Application No. 2013-094464 filed on Apr. 26, 2013, and the content thereof is incorporated herein by way of reference.

INDUSTRIAL APPLICABILITY

According to the present invention, an electrical connection box in which a rattling elimination function is not deteriorated even when a high level of oscillation is generated, and thus, in which there is no concern that a contact portion between a terminal on an electronic component side and a terminal on a connection box main body side are worn out, can be obtained. The present invention which achieves such effects is efficient in an electrical connection box in which a relay is mounted.

REFERENCE SIGNS LIST

10: ELECTRICAL CONNECTION BOX
20: RELAY
20K: LOCKING PROJECTION
30P: STORAGE SPACE
20*t*: MALE TERMINAL
30: CONNECTION BOX MAIN BODY
30B: LINKING PART
30K: PRESSING PROJECTION
30L: PRESS-FIT RIB
30R: ELASTIC LOCKING FRAME PIECE
30T: TERMINAL INSERTION HOLE
30W: GUIDE WALL
31: UPPER COVER
32: LOWER COVER
32*b*: FIXING BRACKET
32R: LOCKING PROJECTION
P1, P1: PROTRUDED PART
W1: FIRST WALL
W2: SECOND WALL
W3: THIRD WALL
W4: FOURTH WALL

The invention claimed is:

1. An electrical connection box, comprising:

an electronic component which has a locking projection; and a connection box main body which has a pressing projection that is engaged with the locking projection, and which is formed with a storage space that stores the electronic component, wherein a guide wall which is provided to stand on a boundary of the storage space is formed across the entire circumference of the boundary of the storage space in the connection box main body, the pressing projection is formed at a narrow linking part of the guide wall in a direction in which the guide wall stands, and a press-fit rib which presses the electronic component when the electronic component is stored in the storage space and in a non-moving state, is formed on a base end side of the guide wall in the connection box main body.

* * * * *